United States Patent [19]

Finley et al.

[11] 4,145,460
[45] Mar. 20, 1979

[54] METHOD OF FABRICATING A PRINTED CIRCUIT BOARD WITH ETCHED THROUGH HOLES

[75] Inventors: Donald W. Finley, Falls Township, Bucks County; Robert B. Lewis, Lower Makefield Township, Bucks County, both of Pa.

[73] Assignee: Western Electric Company, Inc., New York, N.Y.

[21] Appl. No.: 810,461

[22] Filed: Jun. 27, 1977

[51] Int. Cl.² .......................... B05D 5/12; B05D 3/10; B05D 1/32; N05K 3/00
[52] U.S. Cl. .......................... 427/97; 427/98; 427/185; 427/195; 427/259; 427/309; 156/644; 156/656; 156/659; 156/664; 29/625;
[58] Field of Search .................. 427/97, 309, 195, 98, 427/123, 259, 185; 29/625; 156/644, 659, 661, 664

[56] References Cited

U.S. PATENT DOCUMENTS

| 3,423,261 | 1/1969 | Frantzen | 156/644 |
| 3,566,461 | 7/1968 | Carbonel | 29/604 |
| 3,738,879 | 6/1973 | von Siemens | 156/644 |
| 3,934,334 | 1/1976 | Hanni | 427/97 |

OTHER PUBLICATIONS

"Etching Holes in Foil" J. R. DePew et al., IBM Tech. Disclosure Bul. vol. 19, No. 7, Dec. 1976.

Primary Examiner—Michael F. Esposito
Assistant Examiner—Richard Bueker
Attorney, Agent, or Firm—J. F. Spivak

[57] ABSTRACT

A method of fabricating a printed circuit board is disclosed. The method comprises forming a patterned etch resist layer on a metal substrate and selectively etching the substrate to form a through hole with non-linear undercut walls. The etched metal substrate having the resist layer thereon is then coated with a dielectric powder to form a dielectric coat on the substrate having a sufficient through hole edge coverage.

14 Claims, 5 Drawing Figures

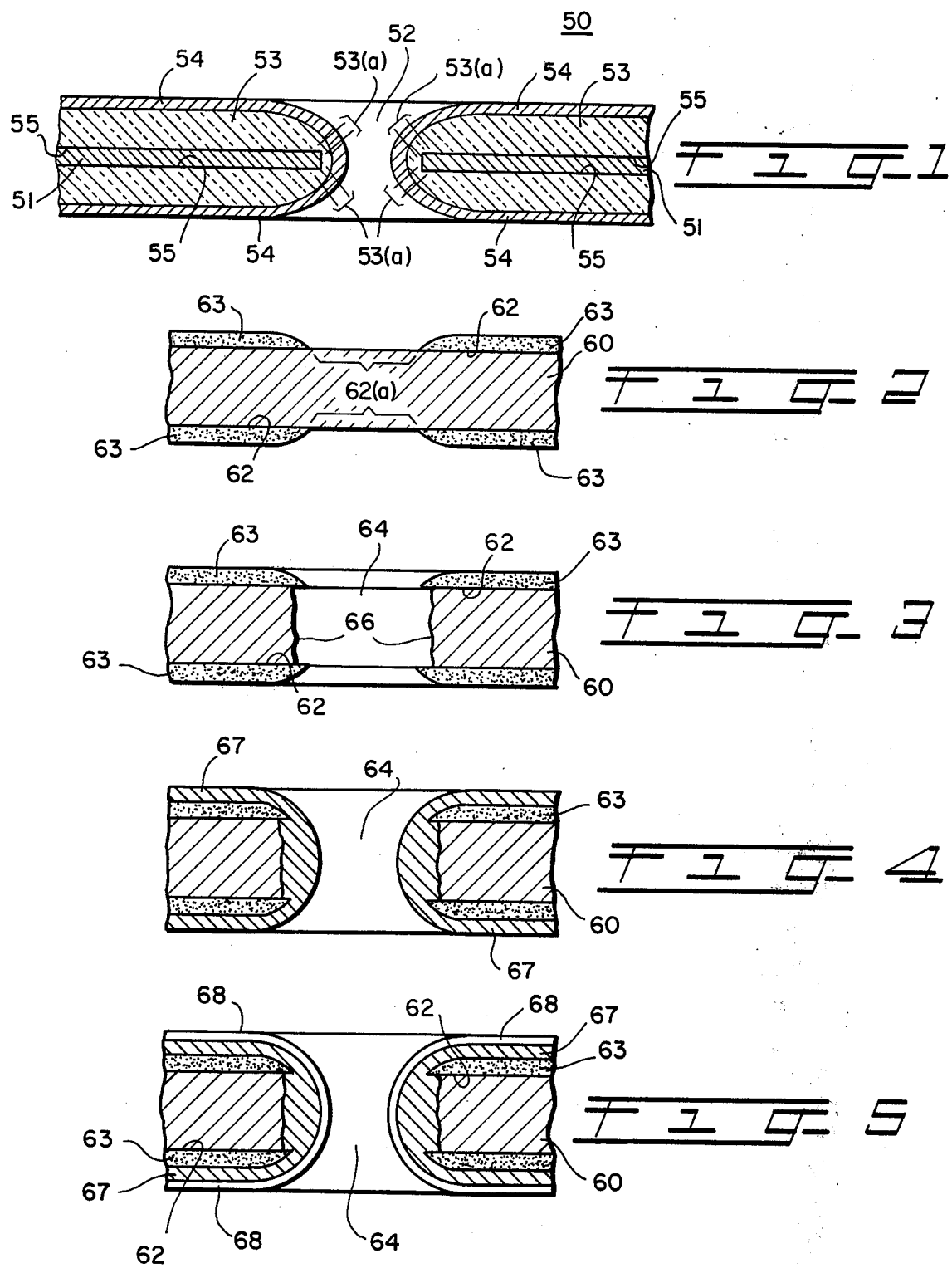

METHOD OF FABRICATING A PRINTED CIRCUIT BOARD WITH ETCHED THROUGH HOLES

BACKGROUND OF THE INVENTION

1. Field of the Invention

This invention relates to printed wiring boards and more particularly to printed wiring boards utilizing metal substrates.

2. Description of the Prior Art

In both additive and subtractive techniques of printed circuit manufacture, a great variety of base materials have been employed as an insulating support. In addition to thick metal blanks, e.g., 16 to 32 mils in thickness, there is great interest in using thin metal blanks, e.g., 1 to 7 mils in thickness, which are coated with dielectric material, for flexible printed wiring boards. In the past, thicker, non-flexible metal blanks, e.g., 16 to 32 mils in thickness, have been coated with dielectric materials using a pre-heated substrate and a fluidized bed powder coating process or an electrostatic coating process. Both of these techniques have a disadvantage where thin (1 to 7 mils thick), flexible metal blanks are contemplated which contain through holes. If such a thin metal blank is coated using known techniques, the dielectric coat obtained either does not provide adequate through hole edge coverage, or, if it does provide adequate edge coverage, the resultant coating is too thick or the surface topography thereof is too rough and not usable for practical purposes. If poor dielectric edge coverage is obtained, then a short will likely take place in the resultant printed wiring board between the metal blank or substrate and the conductive circuit pattern formed on the dielectric coat. If the dielectric coat is too thick, the flexibility of the resultant circuit suffers as well as results in an increase in material costs. Also, where the topography of the surface is rough and uneven, it is very difficult to print or stencil either a conductive pattern or a resist pattern thereon. Also, upon metallization of such a rough surface, the metal deposit obtained will have inherent mechanical stress therein resulting from rough topography.

A process which can yield both rigid and flexible metal printed wiring boards having dielectric coated surface having good edge coverage as well as desirable topography properties is needed and is desired.

SUMMARY OF THE INVENTION

This invention relates to printed wiring boards and more particularly, to printed wiring boards utilizing metal substrates.

The method comprises forming a metal substrate having a through hole with non-linear, undercut walls. The metal substrate is coated with a dielectric powder to form a dielectric coat thereon having a sufficient through hole edge coverage.

BRIEF DESCRIPTION OF THE DRAWINGS

The present invention will be more readily understood by reference to the following drawing taken in conjunction with the detailed description, wherein:

FIG. 1 is a cross-sectional view of a portion of a printed wiring board having a dielectric coating and a conductive layer thereon;

FIG. 2 is a cross-sectional view of a substrate with an etch resist pattern on its principal surfaces;

FIG. 3 is a cross-sectional view of the substrate of FI. 2 after it has been etched with an etchant;

FIG. 4 is a cross-sectional view of the etched substrate of FIG. 3 which has been coated with a dielectric material; and FIG. 5 is a cross-sectional view of the coated substrate of FIG. 4 which has a top coat deposited thereon.

DETAILED DESCRIPTION

Referring now to FIG. 1, there is shown a cross-sectional view of a portion of a flexible printed wiring board 50 fabricated using conventional techniques, such as a fluidized powder bed or electrostatic coating technique. Board 50 has a metal substrate 51, typically ranging from 1 to 7 mils in thickness, with a circuit or through hole 52. A dielectric coat 53 is formed on substrate 51. Deposited on coat 53 is a conductive layer 54 representing a portion of a circuit pattern. In fabricating board 50, using conventional techniques (fluidized bed, electrostatic powder coating), it has been found that the edge coverage or region 53(a) of coat 53 [from an edge of metal substrate 51 to conductive layer 54 in region 53(a)] is unsatisfactory in that it is too thin thereby leading to dielectric breakdown and electrical short circuiting of board 50.

It has been found that dielectric coat 53 should have an edge coverage 53(a) sufficient to resist a 1500 volt dielectric breakdown from conductive layer 54. Thus if the principal thickness of coat 53 is 0.005 inches, then edge coverage 53(a) should have a thickness of at least about 40 percent of the principal thickness. By "principal thickness" is meant the average thickness of dielectric coat 53 covering a principal surface 55 of metal substrate 51. Such an edge coverage may be achieved by a method which involves initially coating a metal substrate with a suitable dielectric powder having specific liquid flow or metal flow properties upon a melting thereof. Such a method is described in the copending patent application of Joseph J. Chang, Ser. No. 785,480, filed on Apr. 7, 1977, now U.S. Pat. No. 4,107,837 entitled "A Method of Fabricating a Printed Circuit," assigned to the assignee hereof, and incorpoated by reference hereinto. Specifically, an adequate edge coverage is achieved by coating a metal substrate, as by an electrostatic technique, with a thermosetting dielectric powder (a polymer) having a suitable flow length value at a particular temperature, e.g., a glass plate flow length value of from about 0.1 cm. to about 0.65 cm. at 150° C. The glass plate flow length value is the value obtained with a procedure where 0.2 gm. of the particular dielectric powder is pressed into a 0.6 cm. diameter pellet at a pressure of 2,000 pounds for several minutes, e.g., ten minutes, using a conventional pelleting apparatus. The pellet is then placed at a 45° angle on a hospital grade glass microscope plate (as sold by Fisher Company and designated as "Fisher brand Microslide), maintained in an oven at a particular temperature, e.g., 150° C. The pellet at first melts and tends to flow until it sets again. The flow length is the total length observed for the polymeric material minus the pellet's initial diameter (0.6 cm.). The flow length value is determined at any temperature between the melting point and the decomposition temperature of the thermosetting powder.

The subject invention, however, leads to an adequate coverage regardless of the liquid flow or melt flow properties of the employed dielectric powder, upon a melting thereof. Referring to FIG. 2, a metal substrate 60, either in sheet or roll form, suitable for a metal printed wiring board, is selected. Some suitable metals include steel, copper, aluminum and alloys of the foregoing. For the fabrication of flexible printed circuits the thickness of metal substrate 60 ranges from about 1 to about 62 mils. The selection of metal substrate 60 is a balance of handling, flexibility and mechanical properties. It is to be noted hereat that metal substrates of up to 7 mils in thickness inherently have poor edge coverage of their through holes unless the subject invention is employed. The through hole edge coverage inadequacy is due to the fact that in relatively thin metal substrates (1 to 10 mils thick), the surface tension effect dominates upon the melting of the coating powder. The surface tension effects at the sharp edges of the through holes predominate and cause the melt (molten powder) to pull away therefrom, thereby leading to a poor edge coverage.

An etch resist pattern 63, typically 0.5 to 3 mils thick, is formed on the principal surfaces 62 of substrate 60. Resist pattern 63 delineates an exposed surface area 62(a) of surface 62 which conforms to a desired through hole.

In a preferred method etch resist pattern 63 is formed on surface 62 by means of printing, for example, by offset printing, in which an ink pattern corresponding to pattern 63 is picked up by a rubber or like transfer roller and applied to surface 62. After the ink image has been transferred to surface 62, surface 62 is dusted with a suitable etch resistant powder, e.g., an epoxy powder. Upon such dusting, sufficient powder adheres to the inked portions of surface 62 in the areas thereof corresponding to pattern 63, due to the tackiness of the ink contained thereon. The excess powder is blown away, as by an air knife, and/or vacuumed off. The adhering powder is heated by a heat source such as a hot air blast or other suitable means to fuse the resist powder and ink to surface 62 to form etch resist pattern 63.

Alternatively, pattern 63 may be formed using conventional photoresist techniques, such as by covering principal surfaces 62 of substrate 60 and then conventionally exposing and developing the applied photoresist. The photoresist employed can be a positive working or a negative working photoresist.

Referring to FIGS. 2 and 3, etch resist patterned substrate 60 is treated with a suitable etchant which attacks and etches away exposed surface area 62(a) of substrate 60 to form a through hole 64. Any etchant which is capable of etching substrate 60 and which does not attack resist pattern 63 may be employed. For a steel substrate, some typical suitable etchants include aqueous solutions of $HNO_3$, $FeCl_3$, and mixtures thereof. For copper metal suitable etchants also include solutions of $CuCl_2$, $(NH_4)_2S_2O_8$. For aluminum suitable etchants also include HCl.

Through hole 64 is formed whereby undercutting of surface 62 of substrate 60 takes place thereby leading to through hole 64 which has walls 66 which are non-linear and undercut. By undercutting of surface 62 is meant that the etching of exposed surface area 62(a) and the underlying portions of substrate 60 takes place in such a fashion that portions of substrate 60 which are originally covered by and underlie portions of resist pattern 63 are also removed or etched away. Such undercutting is accomplished by exposing substrate 60 to the etchant for a sufficiently long period of time whereby etching occurs not only of the exposed portions of substrate 60 but also of the aforementioned unexposed portions of substrate 60. Typically for a one mil thick 1010 steel substrate, an etchant exposure time of about 12 minutes in a 40 Baume $FeCl_3$ solution at 25° C. leads to a through hole having properly undercut walls. Typically, adequate undercutting is evidenced by a through hole having walls which are undercut about 1 to 3 mils under a protective etch resist layer or pattern, such as pattern 63 in FIGS. 2 and 3, delineating the surface area being etched. The degree of undercutting required is of course dependent upon the substrate thickness and electrical properties required. The degree and rate of undercutting of a particular substrate is dependent upon such interdependent parameters as the substrate material, the substrate thickness, the etchant and the temperature of etching. The interdependency of these parameters is known or is easily ascertained by one skilled in the art. The requisite undercutting can be easily determined experimentally by one skilled in the art in view of the disclosure contained herein.

Etched substrate 60 may then be water rinsed, e.g., in deionized water, at 25° C., for about 1 to 10 minutes and then dried, e.g., at 150° C., for about 2 to 10 minutes. The dried substrate 60 is then powder coated with any dielectric powder. Typically, the dried substrate 60 is inserted into a powder booth or bed which is equipped with either conventional manually operated or automatic powder coating guns for electrostatic powder coat application. Some typical conventional electrostatic powder spraying apparatus and techniques are described in *Fundamentals of Powder Coating*, Society of Manufacturing Engineers, 1974. Substate 60 is electrostatically powder coated in the powder booth to obtain a dielectric coat 67 thereon as shown in FIG. 4.

Any dielectric powder may be employed, thermoplastic as well as thermosetting, to obtain dielectric coat 67, provided it is suitable for electronic circuitry. It is to be noted that etch resist pattern 63 does not have to be removed and preferably is not removed prior to applying dielectric coat 67 to substrate 60. Thus, pattern 63 becomes a permanent part of the resultant composite. By this procedure, edge coverage is not only controlled but material is conserved thereby reducing material costs. The dielectric powder employed to form dielectric coat 67 may have any flow length required for surface smoothness since the edge coverage is not a function of its flow.

Dielectric coat 67 has a thickness sufficient to impart the degree of insulation desired without imparting a rigidity which destroys the flexibility. For flexible printed wiring boards, having a metal substrate of 1 to 7 mils, a total dielectric coat 67 having a thickness of up to about 7 mils on each principal surface 62 can be accommodated before there is a rigidity obtained which destroys the use of such a composite as a flexible printed wiring board. For flexible printed wiring boards, a total dielectric coat, comprising a single layer or a plurality of discrete layers, having a thickness in excess of about 7 mils on each principal surface imparts an undesirable rigidity and an additional undesirable cost. Typically, dielectric coat or layer 67 has a thickness of about 3 to 4 mils.

After powder coating, dielectric coated substrate 60 is heated, e.g., in an infrared oven, at a temperature and for a time period sufficient to fuse resultant dielectric coating 67 to substrate 60. For a thermosetting resin, such as an epoxy resin, coated substrate 60 and dielectric coat 67 are heated in an oven at a temperature sufficient to fuse the powder and cure the resin to the "C"

stage, that is the cured state. Typically, for an epoxy resin, substrate 60 and coat 67 are heated at 240° C. for about 2.5 to 3.5 minutes. The resultant fused and fully cured dielectric coat 67 insulates substrate 60 from the electrical circuitry destined to be formed on the top surface of the resultant printed wiring board.

Where a relatively smoother dielectric surface is required, or where a surface layer with special properties is required, substrate 60 having dielectric layer 67 thereon is further treated with a second powder having a melt flow characteristic to impart the desired smoothness to dielectric coat 67. A suitable second powder is one having for example a glass plate flow length value at 150° C. of about 1.2 cm. to about 3.5 cm. In this regard, it is to be pointed out that the second powder may comprise a resin composition which is the same as the first powder, but which has been treated in a different fashion, e.g., it has not been aged or it has been cured to a lesser extent, or the second powder may comprise a different resin composition (thermosetting or thermoplastic) than the first powder. It is of course to be understood that suitable second powders are easily ascertained by one skilled in the art to impart the smoothness desired or required.

Dielectric coated substrate 60 is passed into a second electrostatic powder booth or bed. Referring to FIG. 5, a smooth topcoat 68, comprising the second powder material, is obtained on dielectric coat 67. The thickness of topcoat 68 is only enough to impart the required smoothness to dielectric layer or coat 67. Typically, for a 1 to 7 mils thick steel substrate 60 having a 3 to 4 mils thick dielectric layer 67 on each surface 62, topcoat 68 is about 1 to 2 mils thick for each principal surface 62.

The resultant top coated substrate 60 is then passed into an oven where topcoat 68 is fused to form a continuous coating and to obtain a full cure of any thermosetting resin which may be employed in dielectric coat 67 and/or topcoat 68. Typically, where an epoxy resin is employed in forming dielectric coat 67 and/or topcoat 68, the top-coated substrate 60 is heated at a temperature of about 240° C. for 3 to 5 minutes. By a full cure is meant that the resultant cured resin has been optimized, to the extent possible, with respect to electrical properties, mechanical properties and chemical resistance, i.e., with respect to criteria which are well known in the art and are easily ascertainable experimentally by one skilled in the art. Where an epoxy resin is cured, a full cure typically means that the epoxy or oxirane groups initially present have been consumed during the curing and the degree of crosslinking provides optimum physical properties for a desired application.

The resultant insulated sheet metal substrate (with or without a topcoat) is then passed through standard metallization processes to achieve selective metallization in the form of a desired electrical circuit pattern. In this regard, it is to be noted that an electroless metal catalyzing species, e.g., palladium metal, may be incorporated into either dielectric coat 67 or topcoat 68 (if employed) to form a catalytic layer which can be metallized. However, any conventional metallization technique may be used such as vapor plating, electroless plating, vacuum plating, etc. Typically, the dielectric surface (of coat 67 or topcoat 68, if employed) is subjected to a conventional electroless metal deposition sequence in which a catalytic species is deposited thereon which catalyzes the reduction and deposition of a metal from an electroless metal deposition solution.

The dielectric surface of substrate 60 may be blanket metallized followed by subtractive patterning thereof or may be selectively metallized to achieve the desired conductive circuit. Some typical suitable processes are disclosed by I. B. Goldman, Plating, January 1974, pages 47 through 52, incorporated hereinto by reference.

Another metallizing technique involves depositing a conductive ink or adhesive on the dielectric surface of substrate 60 followed by photoresist masking and electroless metallization thereof. U.S. Pat. No. 3,934,334, incorporated hereinto by reference, discloses one such process.

EXAMPLE I

A 3 inch by 6 inch by 1 mil thick steel (C1010 steel) foil was degreased by immersion for 3 minutes in a 1,1,1-trichloroethane bath maintained at 71° C. The degreased foil substrate was then cleaned in a 8.4 weight percent aqueous $H_3PO_4$ solution maintained at 71° C. for 3 minutes. The substrate was then dried in an infrared oven maintained at 150° C. for 3 to 5 minutes.

An ink comprising 76.3 weight percent of an epoxy novolac resin having an average of 2.2 epoxy groups per molecule ("D.E.N. 431" obtained from the Dow Chemical Company), 9.5 weight percent of a borontrifluoridealiphatic amine complex curing agent ("Anchor 1222" obtained from Pacific Anchor Chemical Company), 11.5 weight percent of a copper phthalocyanine blue pigment ("Imperial X3228" obtained from Hercules Incorporated), 1.9 weight percent of benzyl dodecyl dimethy ammonium salt of montmorillonite clay ("Bentone 27" obtained from NL Industries), and 0.8 weight percent of a polyperfluoroacrylate ("FC-430" obtained from Minnesota Mining & Manufacturing Company), was offset printed on the opposed principal surfaces of the dried substrate to form an ink pattern delineating a circuit through hole pattern comprising a plurality of through holes. While the inked patterns were in a tacky condition, a resist powder comprising 76 weight percent of an epoxy resin mixture comprising (1) 65 weight percent of a first diglycidyl ether of bisphenol A ("Epon 2001" obtained from Shell Chemical Company), (2) 10 weight percent of a second diglycidyl ether of bisphenol A ("Epon 1007" obtained from Shell Chemical Company), (3) 15 weight percent of a carboxyl terminated acrylonitrile-butadiene copolymer ("HYCAR CTBN 1300X13" obtained from B. F. Goodrich Co.), (4) 10 weight percent of a brominated diglycidyl ether of bisphenol A ("Araldite 8011" obtained from CIBA Products Company), (5) 1.8 weight percent of a mixture comprising 2-methyl-imidizole (12 weight percent) and dicyandiamide (86 weight percent) ["DEH 40" obtained from the Dow Chemical Company], (6) 1.2 weight percent of dicyandiamide, (7) 2 weight percent of red iron oxide, (8) 5 weight percent of antimony oxide and (9) 14 weight percent of titanium dioxide, was applied to the principal surfaces whereby portions of the applied powder adhered to the ink patterns. The excess powder was removed from the surfaces by the application of pressurized air thereto from a conventional air gun. The resultant resist powdered patterns and substrate were then heated in a convection oven at 170° C. for 30 minutes to fuse the resist powder and ink to the surfaces to form a resist pattern on both surfaces. The etch resist patterned substrate was then immersed in an aqueous etching solution comprising 95 weight percent HCl and 5 weight percent $HNO_3$ for about 3 to 7 minutes at 25° C. whereby holes were etched in the substrate having non-linear and undercut walls as evidenced by cross-section photographs. The walls exhibited an undercutting of 0.5 to 4 mils.

A dielectric powder comprising the above resist powder formulation was applied to the substrate using a conventional manual powder coating apparatus (Gema 720 obtained from Interrad Corporation) to yield a 6 to 10 mils thick, unfused powder coat on the principal substrate surfaces. The powder employed had a glass plate flow length value of about 1.2 at 150° C. The powder-coated substrate was heated in a convection oven at 170° C. for 30 minutes whereby a 3 to 4 mils thick fused powder coating was obtained. The resultant coating gave an adequate edge coverage of the through hole as evidenced by microscopically examining the cross-sectional area thereof at a magnification of 100. Pictures of the cross-sectional area of the coated through hole were also taken and the edge coverage measured therefrom was at least 40% of the principal thickness of the coating that is of the principal substrate coating thickness.

It is to be understood that the above-described embodiments are simply illustrative of the principles of the invention. Various other modifications and changes may be made by those skilled in the art which will embody the principles of the invention and fall within the spirit and scope thereof.

What is claimed is:

1. A method of preparing a printed wiring board, which comprises:
    (a) forming a patterned etch resist layer on a metal substrate;
    (b) selectively etching said metal substrate, having a thickness of from about 1 to about 7 mils to form a through hole with non-linear, undercut walls; and
    (c) coating said etched substrate having said resist layer thereon with a dielectric powder to form a dielectric coat thereon having a sufficient through hole edge coverage.

2. The method as defined in claim 1 wherein said edge coverage is at least about 40 percent in thickness of the principal thickness of said dielectric coat.

3. The method as defined in claim 2 which further comprises coating said dielectric coated substrate with a second powder to form a topcoat.

4. The method as defined in claim 2 which further comprises forming electrical circuitry on said dielectric coat.

5. The method as defined in claim 1 wherein in step (a) a surface of said metal substrate is selectively coated with an etch resistant pattern to delineate an uncoated surface pattern corresponding to said through hole, and said selectively coated surface is exposed to an etchant to etch said uncoated surface pattern.

6. The method as defined in claim 3 which further comprises forming electrical circuitry on said topcoat.

7. A method of fabricating a printed wiring board, which comprises:
    (a) selectively etching a metal substrate, having a thickness of from about 1 to about 7 mils, and having a patterned etch resist layer thereon, to form a through hole with non-linear, undercut walls;
    (b) coating said substrate and said etch resist layer thereon with a dielectric powder to form a dielectric coat thereon having a sufficient edge coverage;
    (c) coating said dielectric-coated substrate with a second powder to form a suitable topcoat; and
    (d) forming electrical circuitry on said topcoat in conjunction with said through hole.

8. The method as defined in claim 7 wherein in step (a) a surface of said metal substrate is selectively coated with an etch resistant pattern to delineate an uncoated surface pattern corresponding to said through hole, and said selectively coated surface is exposed to an etchant to etch said uncoated surface pattern.

9. A method of preparing a printed wiring board, which comprises:
    (a) forming a patterned etch resist layer on a metal substrate;
    (b) selectively etching said metal substrate to form a through hole with non-linear, undercut walls; and
    (c) coating said etched substrate having said resist layer thereon with a dielectric powder to form a dielectric coat thereon having a sufficient through hole edge coverage.

10. The method as defined in claims 9 which further comprises forming electrical circuitry on said dielectric coat.

11. The method as defined in claim 9 wherein said edge coverage is at least about 40% in thickness of the principal thickness of said dielectric coat.

12. The method as defined in claim 11 which further comprises coating said dielectric-coated substrate with a second powder to form a topcoat.

13. A method of fabricating a printed wiring board, which comprises:
    (a) forming a patterned etch resist layer on a metal substrate;
    (b) selectively etching a metal substrate to form a through hole with non-linear, undercut walls;
    (c) coating said substrate and said etch resist layer thereon with a dielectric powder to form a dielectric coat thereon having a sufficient edge coverage;
    (d) coating said dielectric-coated substrate with a second powder to form a suitable topcoat; and
    (e) forming electrical circuitry on said topcoat in conjunction with said through hole.

14. The method as defined in claim 13 wherein said edge coverage is at least about 40% in thickness of the principal thickness of said dielectric coat.

* * * * *